US006822863B1

(12) United States Patent
Artman et al.

(10) Patent No.: US 6,822,863 B1
(45) Date of Patent: Nov. 23, 2004

(54) AIRFLOW SHROUD MOUNTED FAN SYSTEM AND METHOD FOR COOLING INFORMATION HANDLING SYSTEM COMPONENTS

(75) Inventors: Paul T. Artman, Austin, TX (US); Mark M. Bailey, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 10/643,146

(22) Filed: Aug. 18, 2003

(51) Int. Cl.[7] .................................................. H05K 7/20
(52) U.S. Cl. ...................... 361/695; 361/690; 361/694; 174/16.1; 165/80.3; 165/104.33; 165/122; 454/184
(58) Field of Search ................................. 361/690, 694, 361/695, 619–621; 257/721, 722; 165/80.2, 80.3, 104.33, 122; 174/16.1, 16.3; 454/184

(56) References Cited

U.S. PATENT DOCUMENTS

| | | | |
|---|---|---|---|
| 5,321,581 A | | 6/1994 | Bartilson et al. ............ 361/695 |
| 5,597,035 A | | 1/1997 | Smith et al. ................ 165/80.3 |
| 5,630,469 A | * | 5/1997 | Butterbaugh et al. ....... 165/80.3 |
| 5,936,836 A | * | 8/1999 | Scholder ...................... 361/695 |
| 5,963,424 A | * | 10/1999 | Hileman et al. ............. 361/695 |
| 6,556,440 B2 | | 4/2003 | Jensen et al. ................ 361/687 |
| 6,646,876 B2 | * | 11/2003 | Carr et al. ................... 361/695 |
| 6,678,157 B1 | * | 1/2004 | Bestwick ..................... 361/695 |
| 6,744,630 B2 | * | 6/2004 | Hutchinson et al. ......... 361/687 |
| 2003/0198016 A1 | | 10/2003 | Wobig et al. ................ 361/687 |
| 2004/0004812 A1 | * | 1/2004 | Curlee et al. ................ 361/687 |
| 2004/0136159 A1 | * | 7/2004 | Hein ........................... 361/688 |

* cited by examiner

*Primary Examiner*—Boris Chervinsky
(74) *Attorney, Agent, or Firm*—Hamilton & Terrile, LLP; Robert W. Holland

(57) ABSTRACT

Information handling system component cooling is enhanced with an airflow shroud that directs a primary airflow by a primary fan across the component, the airflow shroud having an opening proximate the component so that a secondary airflow is directed at the component by a secondary fan mounted on the airflow shroud at the opening. The secondary fan removably mounts to the airflow shroud to support hot swapping of a replacement fan and the airflow shroud pivots about a hinge to expose processing components, such as a central processing unit and memory. A finger guard mounted to the airflow shroud across the opening prevents accidental contact with an installed fan.

20 Claims, 5 Drawing Sheets

AIRFLOW SHROUD MOUNTED FAN SYSTEM AND METHOD FOR COOLING INFORMATION HANDLING SYSTEM COMPONENTS

BACKGROUND OF THE INVENTION

1. Field of the Invention

The present invention relates in general to the field of information handling system cooling, and more particularly to an airflow shroud mounted fan system and method for cooling information handling system components.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Over time, information handling systems have consistently improved the speed and quantity of information they can process. This improved processing power results largely through the use of improved electronic components that pack more processing power in less space, such as greater numbers of transistors in processors or greater memory storage in double data rate memory. One difficulty with the greater processing power of information handling system components is that more compact and powerful components tend to create greater amounts of excess heat. The excess heat is typically removed from an information handling system housing with air blown by fans across components or heat sinks attached over components. Failure to remove adequate heat from an information handling system housing will destroy components or, in some cases, reduce the effectiveness of the components at processing information. For instance, the JEDEC DDRII specification presents challenging cooling requirements to maintain case and junction temperatures within the specification.

One solution to the greater amounts of heat produced by more powerful information handling systems is to include larger fans that pass air through housing layouts that improve cooling. However, housings have also decreased in size limiting the options for placement of components and the space available for cooling fans. Further, acoustic requirements have grown more strict as consumers demand quieter systems while larger cooling capacity fans tend to generate greater amounts of noise. One technique that has succeeded in providing more effective cooling for a fan of a given cooling capacity is the use of an airflow shroud that directs the airflow from a cooling fan across the component. Airflow shrouds narrow the width of the airflow provided by a fan so that a greater volume of air travels at a greater velocity over desired components to provide more effective cooling. However, as the heat generated by information processing components continues to increase, even a cooling airflow directed by a shroud has difficulty removing adequate excess heat to ensure proper operation of an information handling system.

SUMMARY OF THE INVENTION

Therefore a need has arisen for a method and system which enhances a cooling airflow provided by an airflow shroud across information handling system components in order to provide improved heat transfer.

In accordance with the present invention, a method and system are provided which substantially reduce the disadvantages and problems associated with previous methods and systems for cooling information handling system components. A fan couples to an airflow shroud proximate to the component and provides a cooling airflow directed at the component through an opening in the shroud.

More specifically, an airflow shroud couples to a housing to direct a primary cooling airflow provided with primary fans across processing components of an information handling system. An opening in the airflow shroud aligns with one or more processing components selected to receive a secondary cooling airflow. A secondary fan mounts to the airflow shroud at the opening to provide the secondary airflow substantially perpendicular to the component for impingement cooling of the component. The secondary fan removably mounts in a tooless manner to the airflow shroud for hot swapping by sliding into fan mount rails extending from the shroud on opposing sides of the opening. Electrical connectors of the fan and shroud align and connect when the fan slides into the rails. A finger guard mounts directly to the shroud in the opening to prevent inadvertent contact with the fan blades. The shroud rotationally couples to the housing with hinges so that pivoting the shroud generally perpendicular to the housing exposes the components disposed in the housing for service or hot swapping.

The present invention provides a number of important technical advantages. One example of an important technical advantage is that improved cooling airflow is directed at an information handling system component by cooling fan integration into an airflow shroud. Airflow directed perpendicular to the component has greater effectiveness for heat transfer than does airflow across the component so that smaller and quieter cooling fans provide a desired cooling effect. Integration of the fan on the airflow shroud leaves the fan accessible for hot swapping that allows the information handling system to continue running as the fan is replaced. Service to underlying components is largely unaffected by the integrated cooling fan since the entire airflow shroud rotates to an open position that exposes the components without handling of the integrated cooling fan. Further, a finger guard incorporated in the airflow shroud below the integrated fan reduces the risk of injury to a technician during service of the information handling system components and provides reduced acoustics and improved airflow compared with a guard installed on the fan itself.

BRIEF DESCRIPTION OF THE DRAWINGS

The present invention may be better understood, and its numerous objects, features and advantages made apparent to FIG. 1 depicts a top perspective view of an airflow shroud having a secondary fan opening and integrated finger guard.

DETAILED DESCRIPTION

Integration of a fan and an airflow shroud improves information handling system component cooling by providing a secondary flow at a component transverse to the airflow through the shroud for impingement cooling of the component. For purposes of this application, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
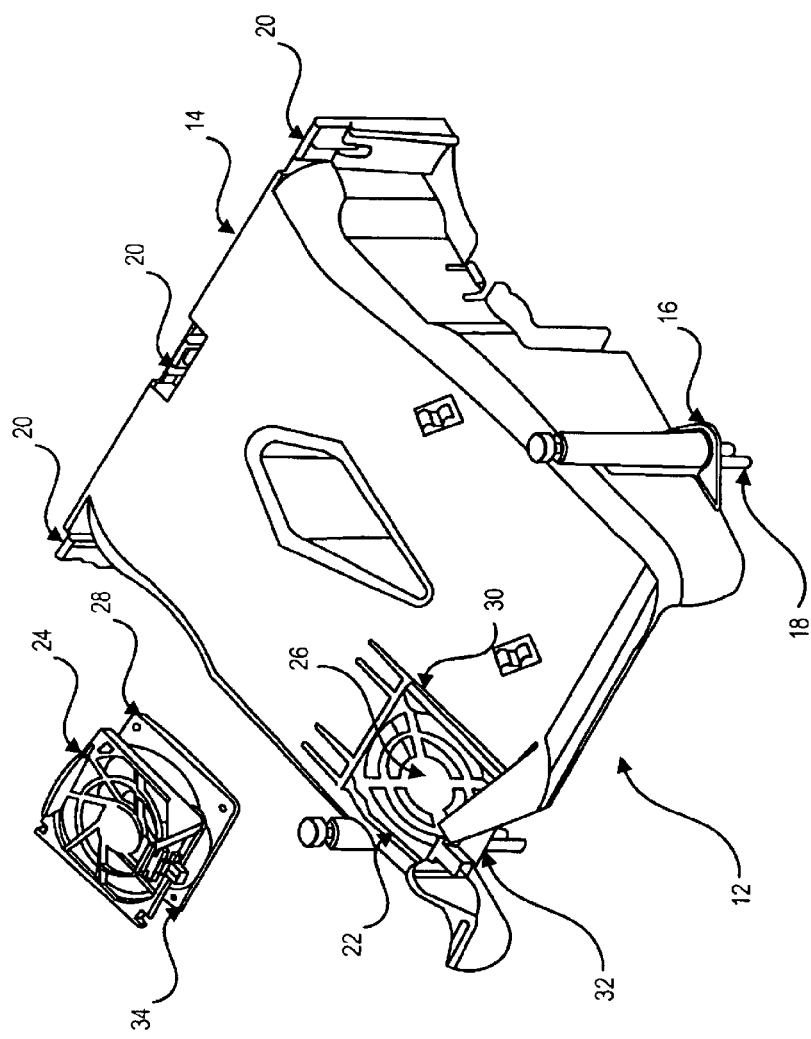
Figure 2:
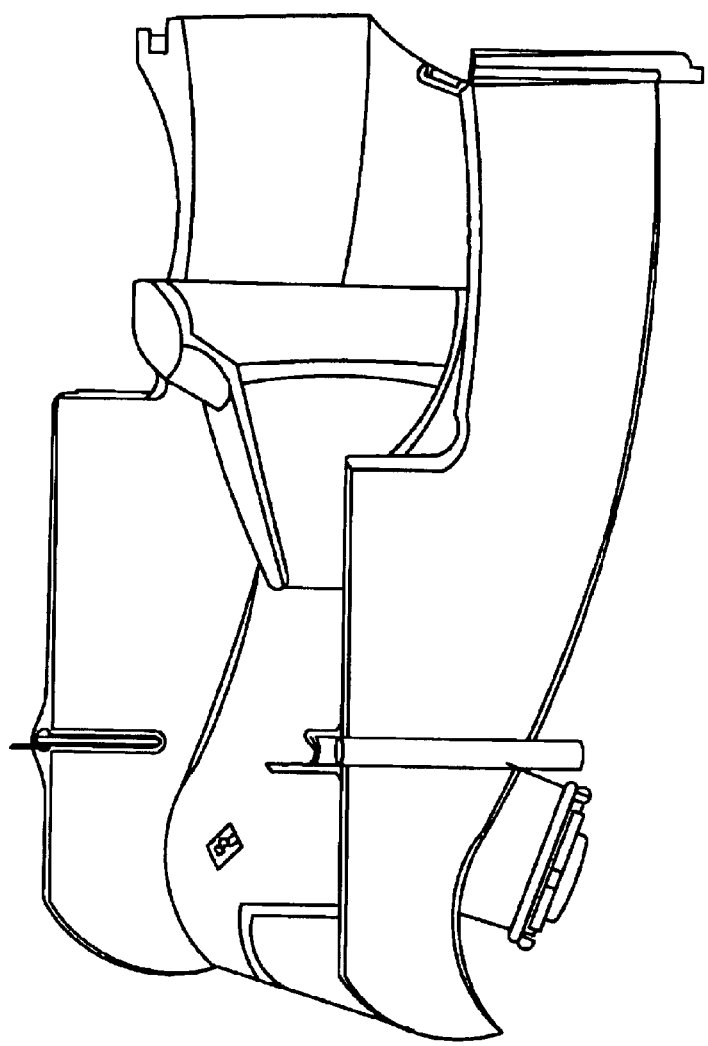
FIG. 2 depicts a bottom perspective view of an airflow shroud forming an air channel.

Referring now to FIG. 1, a top perspective view depicts an airflow shroud 10 for directing airflow to cool information handling system components. Airflow shroud 10 directs cooling air drawn from a vent end 12 across information handling system components located under shroud 10 and out a fan exhaust end 14. Fan exhaust end 14 rests over two fans that pull the cooling air through shroud 10. As depicted by FIG. 2, the inner surface of shroud 10 defines an airflow channel so that a greater portion of the air pulled by the fans passes across and cools information handling system components. The base 16 of shroud 10 locks to the housing of an information handling system with releasable bolts 18 and to the side of the housing with hinges 20. After installation within a housing, airflow shroud 10 rotates about hinges 20 when bolt 18 is released to allow access to components disposed below shroud 10.

Figure 3:
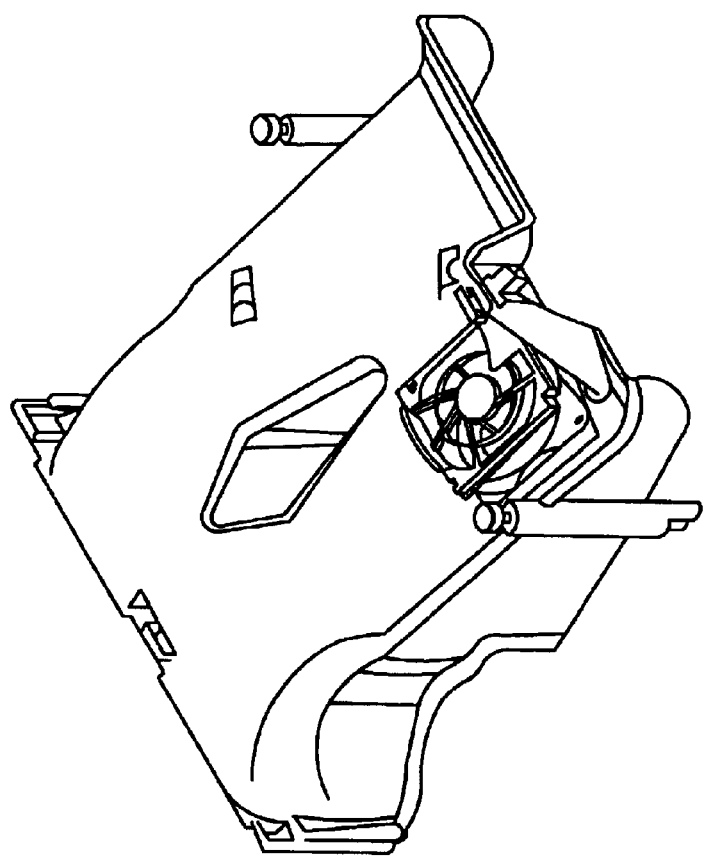
FIG. 3 depicts a top perspective view of an a secondary fan mounted on an airflow shroud.

A secondary airflow opening 22 formed in the upper surface of shroud 10 allows a secondary fan 24 to blow a secondary airflow into the air channel formed by the inner surface of shroud 10. A finger guard 26 mounts to opening 22 to protect against inadvertent insertion of an object into the blades of fan 24. Fan 24 mounts to shroud 10 at opening 26 by inserting the lower edges 28 of fan 24 into parallel rails 30 opposing each other across opening 22 and then sliding fan 24 into rails 30 to cover opening 22 as depicted by FIG. 3. An electrical power source connection 32 aligns with a fan power connection 34 and connects upon complete insertion of fan 24 into rails 30. In addition, electrical connectors 32 and 34 may communicate information to and from the fan, such as tachometer readings and power control signals.

In operation, fan 24 and opening 22 align over one or more selected processing components, such as the CPU or memory of an information handling system, to provide transverse airflow downward toward the processing component for impingement cooling. The secondary airflow from fan 24 travels generally perpendicular to the primary airflow through the channel of shroud 10 to impact the upper portion of the desired component and flow air away from the center of the component. The close proximity of fan 24 to a component allows effective cooling airflows with reduced fan speeds so that thermal dissipation requirements are met with reduced acoustics. Improved airflow and reduced acoustics are also provided by the mounting of finger guard 26 in opening 22 instead of mounting of a finger guard on fan 24. The sliding rail fan mount 30 allows tooless insertion and removal of fan 24 to support hot swapping during operation of an information handling system.

Figure 4:
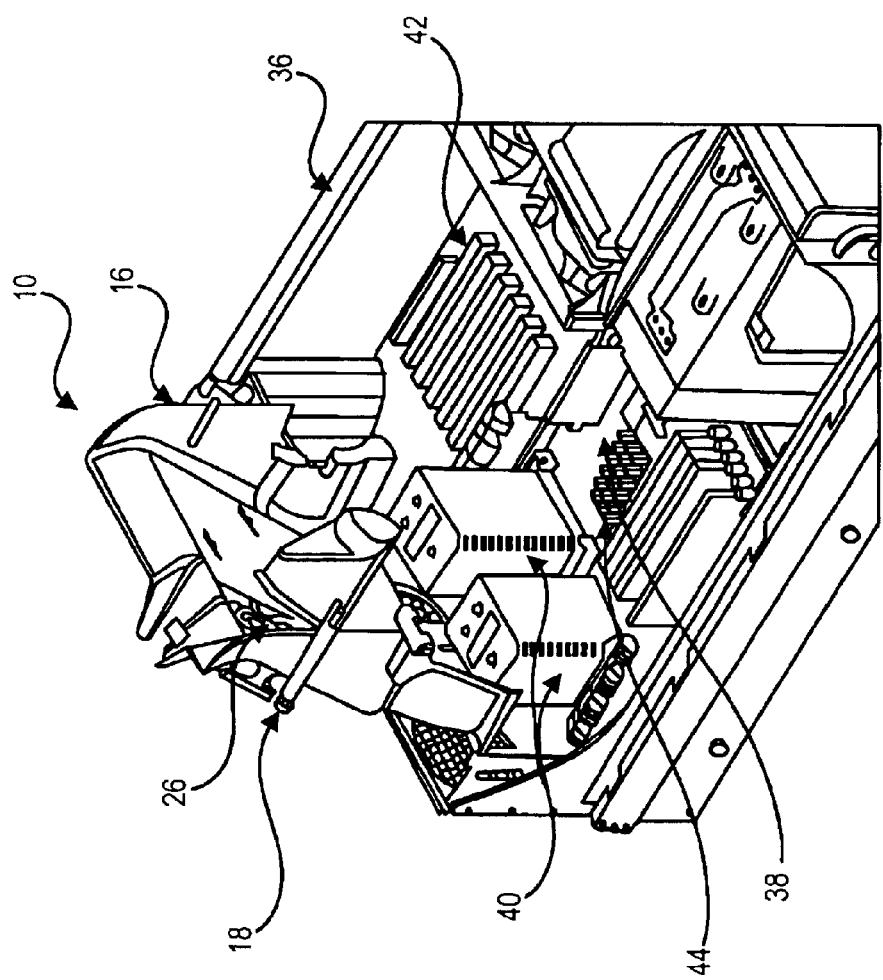
FIG. 4 depicts an information handling system having an airflow shroud rotated up to expose information processing components.
Figure 5:
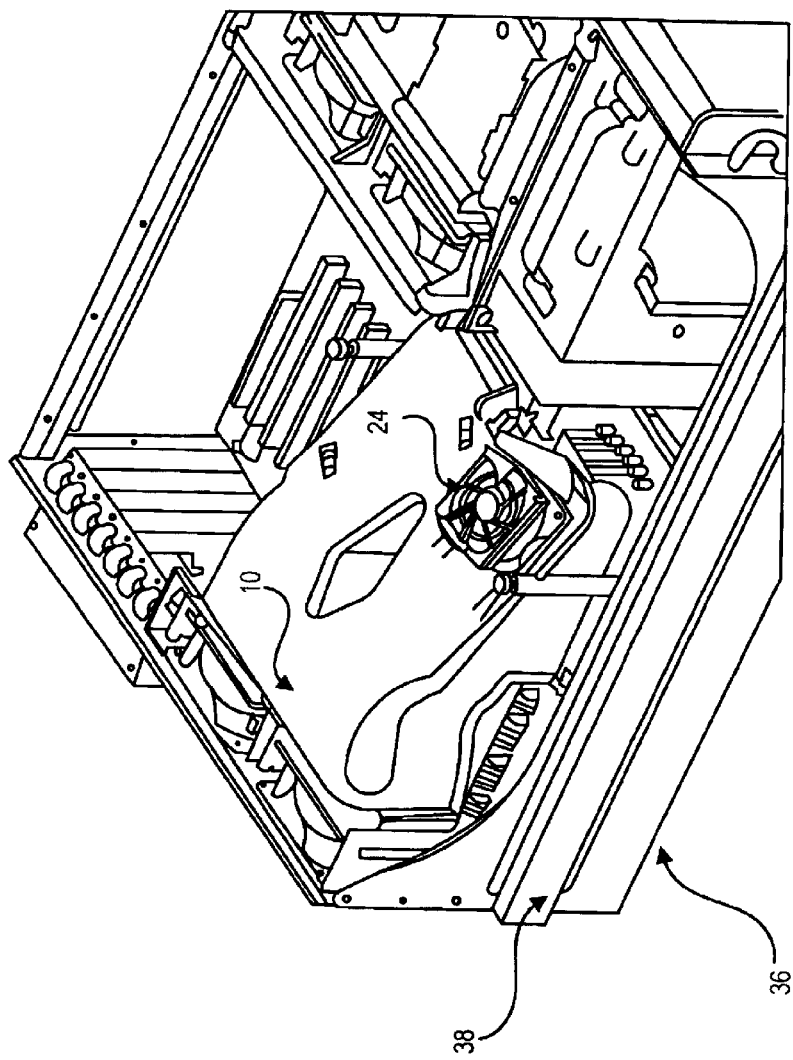
FIG. 5 depicts an information handling system having an airflow shroud with a secondary fan installed over a processing component.

Referring now to FIG. 4, airflow shroud 10 is depicted installed in an information handling system 36 with base 16 rotated away from the lower surface of the housing 38 to expose processing components. Two primary fans 40 couple to housing 38 aligned under the fan exhaust end 14 of shroud 10. Fans 40 pull a primary airflow across information processing components disposed in housing 38, such as memory 42 and a CPU installed under a heat sink 44. In the raised position, fan guard 26 prevents inadvertent contact with fan 24, which continues to receive power through connector 32 by a power cord routed near hinges 20. The raised position permits service to components under shroud 10, such as hot swapping. Opening 22 aligns with CPU 44 so that closing of shroud 10 to the closed position depicted by FIG. 5 directs the secondary airflow from fan 24 at CPU 44. Further, in the closed shroud position, fan 24 is accessible to a technician for hot swapping, such as for removal of a faulty fan and replacement with a new fan. In alternative embodiments, the secondary fan 24 may integrate in shroud 10 over other types of components to provide a desired secondary cooling airflow.

Although the present invention has been described in detail, it should be understood that various changes, substitutions and alterations can be made hereto without departing from the spirit and scope of the invention as defined by the appended claims.

What is claimed is:

1. An information handling system comprising:
    a housing having a fan opening;
    plural processing components disposed in the housing and operable to process information;
    a fan coupled to the housing at the fan opening and operable to flow cooling air across the processing components;
    an airflow shroud disposed in the housing and having an air channel extending from the fan opening to one or more selected processing components and an opening proximate the selected processing components, the airflow shroud operable to direct cooling air to flow across the selected processing components; and
    a fan coupled to the airflow shroud at the opening proximate the selected processing components, the fan aligned to flow cooling air at the selected processing components.

2. The information handling system of claim 1 further comprising a finger guard coupled to the airflow shroud at the airflow shroud opening.

3. The information handling system of claim 1 wherein the fan coupled to the airflow shroud aligns to flow air substantially perpendicular to the selected processing components to provide impingement cooling.

4. The information handling system of claim 3 wherein the selected components comprise memory.

5. The information handling system of claim 3 wherein the selected components comprise a CPU.

6. The information handling system of claim 1 further comprising a hinge rotationally coupling the airflow shroud to the housing, the airflow shroud rotating to a substantially perpendicular position that exposes the selected processing components.

7. The information handling system of claim 1 further comprising a fan mount proximate the airflow shroud fan opening and operable to releasably couple the fan to the airflow shroud.

8. The information handling system of claim 7 wherein the fan mount comprises a pair of parallel rails on opposing sides of the airflow shroud fan opening, the rails extending from the airflow shroud and operable to engage the fan by sliding the fan between the rails.

9. The information handling system of claim 8 further comprising:
   a fan electrical connector extending from the fan and operable to accept power to operate the fan; and
   an airflow shroud electrical connector operable to provide power to the fan, the airflow shroud electrical connector aligned to couple with the fan electrical connector upon sliding of the fan between the rails.

10. A method for cooling an information handling system component, the method comprising:
    providing a primary cooling airflow across the component with a primary fan, the primary fan associated with an opening in the housing of the information handling system;
    directing the primary cooling airflow to the component with a shroud that forms an air channel between the component and the housing opening; and
    providing a secondary cooling airflow at the component with a secondary fan, the secondary fan coupled to an opening in the shroud proximate the component.

11. The method of claim 10 wherein providing a secondary cooling airflow further comprises removably mounting the secondary fan to the shroud at the shroud opening.

12. The method of claim 10 further comprising:
    removing the secondary fan from the shroud while the information handling system is operating; and
    replacing the secondary fan with another secondary fan by mounting the replacement secondary fan to the shroud at the shroud opening while the information handling system is operating.

13. The method of claim 10 wherein the secondary airflow is substantially perpendicular to the primary airflow.

14. The method of claim 10 further comprising mounting a finger guard to the shroud across the shroud opening.

15. The method of claim 10 wherein the component comprises a central processing unit.

16. The method of claim 10 wherein the component comprises memory.

17. An airflow shroud for directing cooling air flow through an information handling system having heat-producing components, the airflow shroud comprising:
    a housing forming a channel operable to direct a primary airflow between an opening in the information handling system and a component of the information handling system, the housing having an opening formed proximate the component; and
    a fan mounted on the housing at the opening, the fan aligned to direct a secondary airflow through the opening at the component.

18. The airflow shroud of claim 17 further comprising a finger guard mounted on the housing across the opening between the fan and the component.

19. The airflow shroud of claim 16 further comprising:
    a fan mount integrated with the housing at the opening and operable to releasably mount the fan to the housing.

20. The airflow shroud of claim 19 wherein the fan mount comprises:
    parallel rail disposed on opposing sides of the opening and aligned to engage a fan slid between the rails; and
    an electrical connector extending from the housing, the electrical connector aligned to couple with a fan electrical connector and operable to provide power to the fan.

* * * * *